US 8,537,755 B2

(12) United States Patent
Rasquinha (10) Patent No.: US 8,537,755 B2
(45) Date of Patent: Sep. 17, 2013

(54) RATE MATCHING DEVICE

(75) Inventor: Nelson D. Rasquinha, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 179 days.

(21) Appl. No.: 13/103,935

(22) Filed: May 9, 2011

(65) Prior Publication Data

US 2011/0280186 A1    Nov. 17, 2011

Related U.S. Application Data

(60) Provisional application No. 61/333,595, filed on May 11, 2010.

(51) Int. Cl.
*H04W 4/00* (2009.01)

(52) U.S. Cl.
USPC .......................................................... 370/328

(58) Field of Classification Search
None
See application file for complete search history.

(56) References Cited

U.S. PATENT DOCUMENTS

| | | | |
|---|---|---|---|
| 5,907,586 | A | 5/1999 | Katsuragawa et al. |
| 6,621,873 | B1 | 9/2003 | Lee et al. |
| 6,907,020 | B2 | 6/2005 | Periyalwar et al. |
| 7,397,861 | B2 | 7/2008 | Frederiksen et al. |
| 2003/0014715 | A1 | 1/2003 | Lobinger et al. |
| 2005/0172201 | A1 * | 8/2005 | Kutz et al. ...................... 714/755 |
| 2008/0301536 | A1 * | 12/2008 | Shin et al. ...................... 714/786 |
| 2008/0307293 | A1 * | 12/2008 | Cheng ............................ 714/790 |
| 2008/0320353 | A1 * | 12/2008 | Blankenship et al. ........ 714/746 |
| 2009/0041110 | A1 * | 2/2009 | Malladi ......................... 375/240 |
| 2009/0049359 | A1 * | 2/2009 | Malladi et al. ................ 714/752 |
| 2009/0086849 | A1 * | 4/2009 | Tsai et al. ...................... 375/298 |
| 2010/0058136 | A1 * | 3/2010 | Lee et al. ....................... 714/748 |
| 2011/0060970 | A1 * | 3/2011 | Kim et al. ...................... 714/786 |
| 2012/0147988 | A1 * | 6/2012 | Neeman et al. ................ 375/295 |
| 2012/0320951 | A1 * | 12/2012 | Han et al. ...................... 375/141 |

OTHER PUBLICATIONS

Anonymous: "3GPP TS 27.002:V9.0.0, 3rd Generation Partnership Project; Technical Specification Group Core Network; Terminal Adaptation Functions (TAF) for services using asynchronous bearer capabilities (Release 9)", Dec. 2009, XP002652581, Retrieved from the Internet: URL: http://www.quintillion.co.jp/3GPP/Specs/27002-900.pdf [retrieved on Jul. 22, 2011] the whole document.
Clark Cain, "Error-Correction Coding for Digital Communications", 1990, Plenum Press, XP002652553, pp. 345-352, section 8.3.2; the whole document.

(Continued)

*Primary Examiner* — Otis L Thompson, Jr.
(74) *Attorney, Agent, or Firm* — Kam T. Tam (57) ABSTRACT

In rate matching and interleaving in a Long Term Evolution (LTE) system, use of a circular buffer following interleaving may be avoided by reading out interleaved data directly from the interleaver in a manner which matches an expected output from a circular buffer. The read out data may be rate matched according to instructions from upper layers. The order in which the data is read out is configured to match the expected rate matched output from a circular buffer. In this manner use of a circular buffer may be avoided, resulting in saved memory costs.

16 Claims, 8 Drawing Sheets

(56) References Cited

OTHER PUBLICATIONS

"Digital cellular telecommunications system (Phase 2+); Universal Mobile Telecommunications System (UMTS) ; LTE; E-UTRA, UTRA and GSM/EDGE ; Multi -Standard Radio (MSR) Base Station (BS) radio transmission and reception (3GPP TS 37.104 version 9.0.0 Release 9)" Technical Specification, European Telecommunications Standards Institute (ETSI), 650, Route Des Lucioles ; F-06921 Sophia-Antipolis ; France, vol. 3GPP RAN 4, No. V9.0.0, Feb. 1, 2010, XP014046954, the whole document.

International Search Report and Written Opinion—PCT/US2011/036069—ISA/EPO—Aug. 8, 2011.

* cited by examiner

FIG. 6 READ OUT TO MODULATOR

RATE MATCHING DEVICE

CROSS REFERENCE TO RELATED APPLICATION

This application claims the benefit of U.S. provisional patent application No. 61/333,595, entitled, "RATE MATCHING DEVICE", filed May 11, 2010, the disclosure of which is expressly incorporated herein by reference in its entirety.

BACKGROUND

1. Field

The present disclosure relates generally to communication systems, and more particularly, to rate matching Long Term Evolution (LTE) code blocks without a circular buffer.

2. Background

Wireless communication networks are widely deployed to provide various communication services such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

A wireless communication network may include a number of base stations that can support communication for a number of user equipments (UEs). A UE may communicate with a base station via the downlink and uplink. The downlink (or forward link) refers to the communication link from the base station to the UE, and the uplink (or reverse link) refers to the communication link from the UE to the base station.

A base station may transmit data and control information on the downlink to a UE and/or may receive data and control information on the uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance the UMTS technologies not only to meet the growing demand for mobile broadband access, but to advance and enhance the user experience with mobile communications.

SUMMARY

Offered is a method of rate-matching in a Long Term Evolution (LTE) wireless communication system. The method includes receiving data streams from an encoder. The method also includes writing the data streams into memory. The method further includes performing interleaving and rate matching of the data streams. The method further includes reading out the interleaved and rate matched data in an order formatted to mimic an output from a circular buffer.

Offered is an apparatus for rate-matching in a Long Term Evolution (LTE) wireless communication system. The apparatus includes means for receiving data streams from an encoder. The apparatus also includes means for writing the data streams into memory. The apparatus further includes means for performing interleaving and rate matching of the data streams. The apparatus further includes means for reading out the interleaved and rate matched data in an order formatted to mimic an output from a circular buffer.

Offered is a computer program product for rate-matching in a Long Term Evolution (LTE) wireless communication system. The computer program product includes a non-transitory computer-readable medium having non-transitory program code recorded thereon. The program code includes program code to receive data streams from an encoder. The program code also includes program code to write the data streams into memory. The program code further includes program code to perform interleaving and rate matching of the data streams. The program code further includes program code to read out the interleaved and rate matched data in an order formatted to mimic an output from a circular buffer.

Offered is an apparatus for rate-matching in a Long Term Evolution (LTE) wireless communication system. The apparatus includes a memory and a processor(s) coupled to the memory. The processor(s) is configured to receive data streams from an encoder. The processor(s) is also configured to write the data streams into memory. The processor(s) is further configured to perform interleaving and rate matching of the data streams. The processor(s) is further configured to read out the interleaved and rate matched data in an order formatted to mimic an output from a circular buffer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). These various radio technologies and standards are known in the art. For clarity, certain aspects of the techniques are described below for LTE, and LTE terminology is used in much of the description below.

The techniques described herein may be used for various wireless communication networks such as CDMA, TDMA, FDMA, OFDMA, SC-FDMA and other networks. The terms "network" and "system" are often used interchangeably. A CDMA network may implement a radio technology, such as Universal Terrestrial Radio Access (UTRA), Telecommunications Industry Association's (TIA's) CDMA2000®, and the like. The UTRA technology includes Wideband CDMA (WCDMA) and other variants of CDMA. The CDMA2000® technology includes the IS-2000, IS-95 and IS-856 standards from the Electronics Industry Alliance (EIA) and TIA. A TDMA network may implement a radio technology, such as Global System for Mobile Communications (GSM). An OFDMA network may implement a radio technology, such as Evolved UTRA (E-UTRA), Ultra Mobile Broadband (UMB), IEEE 802.11 (Wi-Fi), IEEE 802.16 (WiMAX), IEEE 802.20, Flash-OFDMA, and the like. The UTRA and E-UTRA technologies are part of Universal Mobile Telecommunication System (UMTS). 3GPP Long Term Evolution (LTE) and LTE-Advanced (LTE-A) are newer releases of the UMTS that use E-UTRA. UTRA, E-UTRA, UMTS, LTE, LTE-A and GSM are described in documents from an organization called the "3rd Generation Partnership Project" GPP). CDMA2000® and UMB are described in documents from an organization called the "3rd Generation Partnership Project 2" (3GPP2). The techniques described herein may be used for the wireless networks and radio access technologies mentioned above, as well as other wireless networks and radio access technologies. For clarity, certain aspects of the techniques are described below for LTE or LTE-A (together referred to in the alternative as "LTE/-A") and use such LTE/-A terminology in much of the description below.

Figure 1:
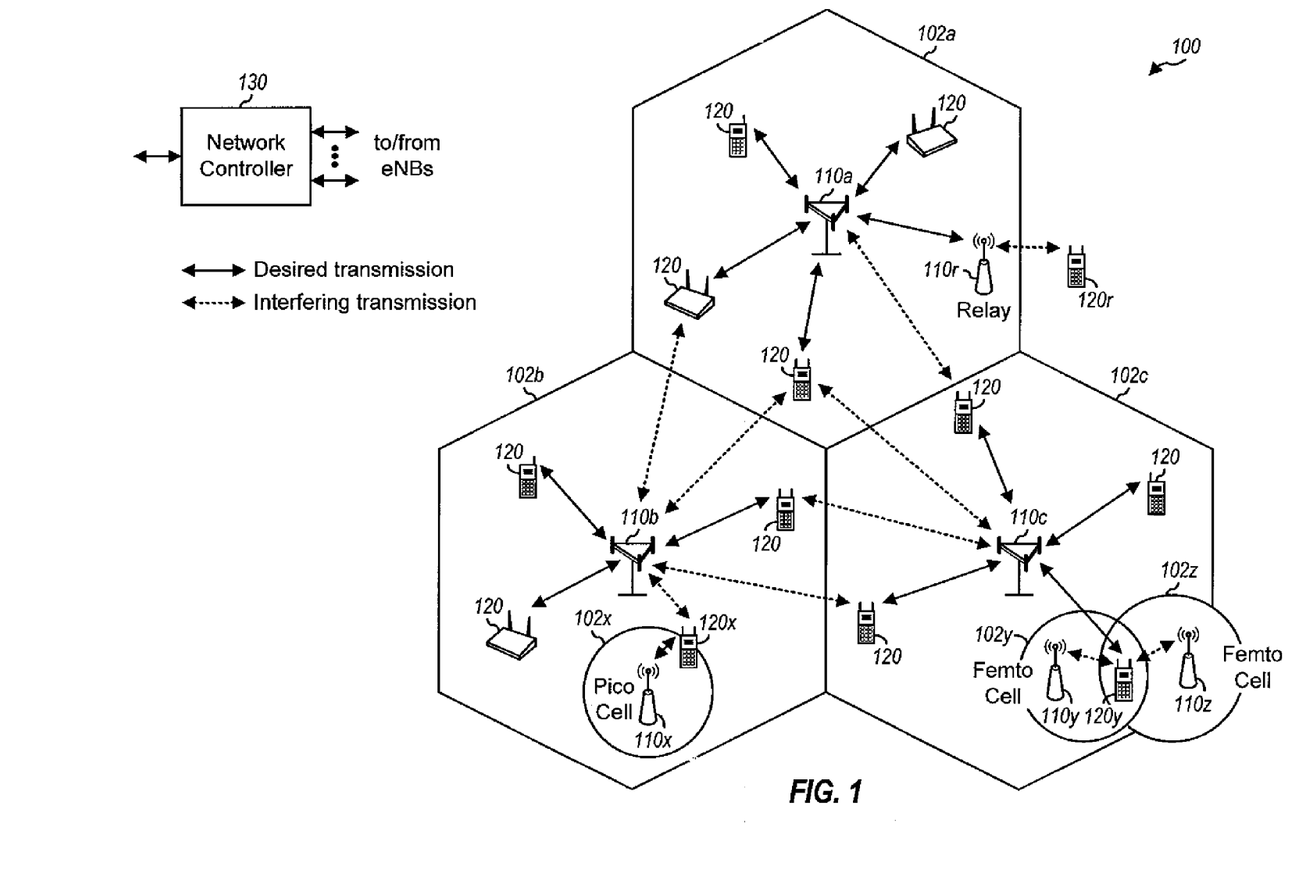
FIG. 1 is a block diagram conceptually illustrating an example of a mobile communication system.

FIG. 1 shows a wireless communication network 100, which may be an LTE-A network. The wireless network 100 includes a number of evolved node Bs (eNodeBs) 110 and other network entities. An eNodeB may be a station that communicates with the UEs and may also be referred to as a base station, a node B, an access point, and the like. Each eNodeB 110 may provide communication coverage for a particular geographic area. In 3GPP, the term "cell" can refer to this particular geographic coverage area of an eNodeB and/or an eNodeB subsystem serving the coverage area, depending on the context in which the term is used.

An eNodeB may provide communication coverage for a macro cell, a pico cell, a femto cell, and/or other types of cell. A macro cell generally covers a relatively large geographic area (e.g., several kilometers in radius) and may allow unrestricted access by UEs with service subscriptions with the network provider. A pico cell would generally cover a relatively smaller geographic area and may allow unrestricted access by UEs with service subscriptions with the network provider. A femto cell would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). An eNodeB for a macro cell may be referred to as a macro eNodeB. An eNodeB for a pico cell may be referred to as a pico eNodeB. And, an eNodeB for a femto cell may be referred to as a femto eNodeB or a home eNodeB. In the example shown in FIG. 1, the eNodeBs 110a, 110b and 110c are macro eNodeBs for the macro cells 102a, 102b and 102c, respectively. The eNodeB 110x is a pico eNodeB for a pico cell 102x. And, the eNodeBs 110y and 110z are femto eNodeBs for the femto cells 102y and 102z, respectively. An eNodeB may support one or multiple (e.g., two, three, four, and the like) cells.

The wireless network 100 may also include relay stations. A relay station is a station that receives a transmission of data and/or other information from an upstream station (e.g., an eNodeB, UE, etc.) and sends a transmission of the data and/or other information to a downstream station (e.g., a UE or an eNodeB). A relay station may also be a UE that relays transmissions for other UEs. In the example shown in FIG. 1, a relay station 110r may communicate with the eNodeB 110a and a UE 120r in order to facilitate communication between the eNodeB 110a and the UE 120r. A relay station may also be referred to as a relay eNodeB, a relay, etc.

The wireless network 100 may be a heterogeneous network that includes eNodeBs of different types, e.g., macro eNodeBs, pico eNodeBs, femto eNodeBs, relays, etc. These different types of eNodeBs may have different transmit power levels, different coverage areas, and different impact on interference in the wireless network 100. For example, macro eNodeBs may have a high transmit power level (e.g., 20 Watts) whereas pico eNodeBs, femto eNodeBs and relays may have a lower transmit power level (e.g., 1 Watt).

The wireless network 100 may support synchronous or asynchronous operation. For synchronous operation, the eNodeBs may have similar frame timing, and transmissions from different eNodeBs may be approximately aligned in time. For asynchronous operation, the eNodeBs may have different frame timing, and transmissions from different eNodeBs may not be aligned in time. The techniques described herein may be used for either synchronous or asynchronous operations.

In one aspect, the wireless network 100 may support Frequency Division Duplex (FDD) or Time Division Duplex (TDD) modes of operation. The techniques described herein may be used for either FDD or TDD mode of operation.

A network controller 130 may couple to a set of eNodeBs 110 and provide coordination and control for these eNodeBs 110. The network controller 130 may communicate with the eNodeBs 110 via a backhaul. The eNodeBs 110 may also communicate with one another, e.g., directly or indirectly via a wireless backhaul or a wireline backhaul.

The UEs 120 are dispersed throughout the wireless network 100, and each UE may be stationary or mobile. A UE may also be referred to as a terminal, a mobile station, a subscriber unit, a station, or the like. A UE may be a cellular phone, a personal digital assistant (PDA), a wireless modem, a wireless communication device, a handheld device, a laptop computer, a cordless phone, a wireless local loop (WLL) station, a tablet, or the like. A UE may be able to communicate with macro eNodeBs, pico eNodeBs, femto eNodeBs, relays, and the like. In FIG. 1, a solid line with double arrows indicates desired transmissions between a UE and a serving eNodeB, which is an eNodeB designated to serve the UE on the downlink and/or uplink. A dashed line with double arrows indicates interfering transmissions between a UE and an eNodeB.

LTE utilizes orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, or the like. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for a corresponding system bandwidth of 1.25, 2.5, 5, 10 or 20 megahertz (MHz), respectively. The system bandwidth may also be partitioned into sub-bands. For example, a sub-band may cover 1.08 MHz (i.e., 6 resource blocks), and there may be 1, 2, 4, 8 or 16 sub-bands for a corresponding system bandwidth of 1.25, 2.5, 5, 10 or 20 MHz, respectively.

Figure 2:
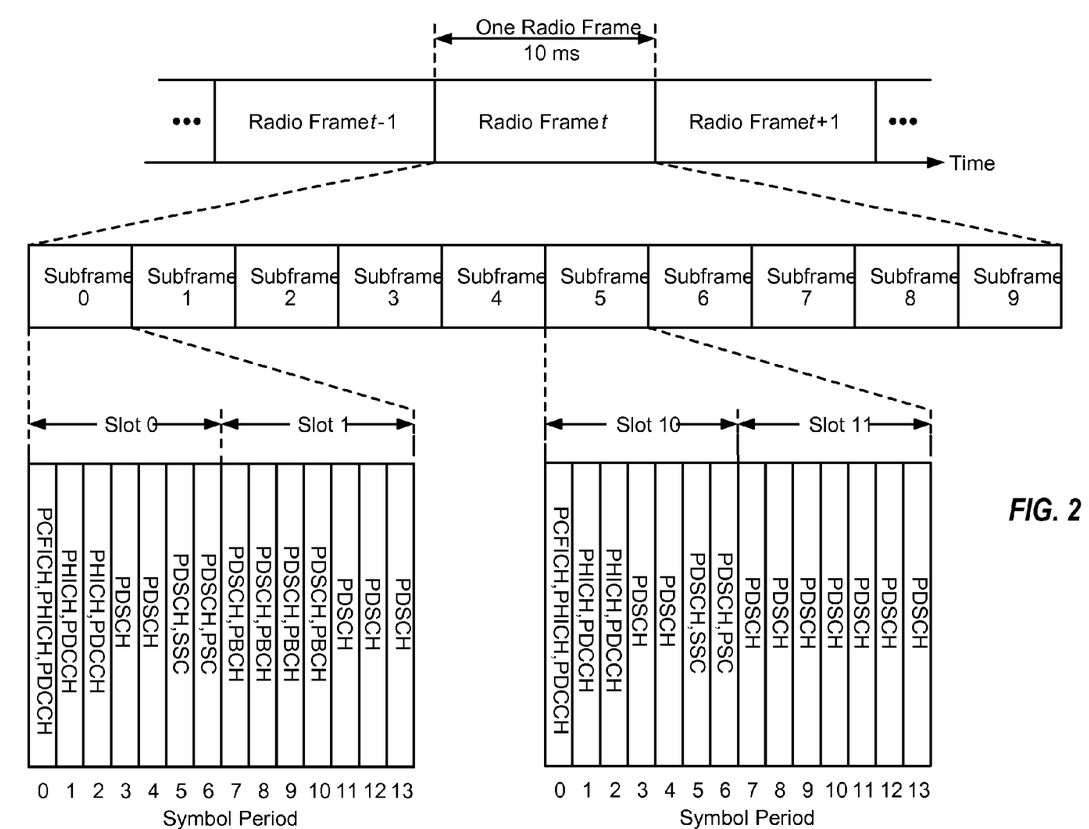
FIG. 2 is a block diagram conceptually illustrating an example of a downlink frame structure in a mobile communication system.

FIG. 2 shows a downlink FDD frame structure used in LTE. The transmission timeline for the downlink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., 7 symbol periods for a normal cyclic prefix (as shown in FIG. 2) or 6 symbol periods for an extended cyclic prefix. The 2L symbol periods in each subframe may be assigned indices of 0 through 2L−1. The available time frequency resources may be partitioned into resource blocks. Each resource block may cover N subcarriers (e.g., 12 subcarriers) in one slot.

In LTE, an eNodeB may send a primary synchronization signal (PSC or PSS) and a secondary synchronization signal (SSC or SSS) for each cell in the eNodeB. For FDD mode of operation, the primary and secondary synchronization signals may be sent in symbol periods 6 and 5, respectively, in each of subframes 0 and 5 of each radio frame with the normal cyclic prefix, as shown in FIG. 2. The synchronization signals may be used by UEs for cell detection and acquisition. For FDD mode of operation, the eNodeB may send a Physical Broadcast Channel (PBCH) in symbol periods 0 to 3 in slot 1 of subframe 0. The PBCH may carry certain system information.

The eNodeB may send a Physical Control Format Indicator Channel (PCFICH) in the first symbol period of each subframe, as seen in FIG. 2. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. In the example shown in FIG. 2, M=3. The eNodeB may send a Physical HARQ Indicator Channel (PHICH) and a Physical Downlink Control Channel (PDCCH) in the first M symbol periods of each subframe. The PDCCH and PHICH are also included in the first three symbol periods in the example shown in FIG. 2. The PHICH may carry information to support hybrid automatic repeat request (HARQ). The PDCCH may carry information on uplink and downlink resource allocation for UEs and power control information for uplink channels. The eNodeB may send a Physical Downlink Shared Channel (PDSCH) in the remaining symbol periods of each subframe. The PDSCH may carry data for UEs scheduled for data transmission on the downlink.

The eNodeB may send the PSC, SSC and PBCH in the center 1.08 MHz of the system bandwidth used by the eNodeB. The eNodeB may send the PCFICH and PHICH across the entire system bandwidth in each symbol period in which these channels are sent. The eNodeB may send the PDCCH to groups of UEs in certain portions of the system bandwidth. The eNodeB may send the PDSCH to groups of UEs in specific portions of the system bandwidth. The eNodeB may send the PSC, SSC, PBCH, PCFICH and PHICH in a broadcast manner to all UEs, may send the PDCCH in a unicast manner to specific UEs, and may also send the PDSCH in a unicast manner to specific UEs.

A number of resource elements may be available in each symbol period. Each resource element may cover one subcarrier in one symbol period and may be used to send one modulation symbol, which may be a real or complex value. For symbols that are used for control channels, the resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1 and 2. The PDCCH may occupy 9, 18, 36 or 72 REGs, which may be selected from the available REGs, in the first M symbol periods. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for all UEs in the PDCCH. An eNodeB may send the PDCCH to the UE in any of the combinations that the UE will search.

A UE may be within the coverage of multiple eNodeBs. One of these eNodeBs may be selected to serve the UE. The serving eNodeB may be selected based on various criteria such as received power, path loss, signal-to-noise ratio (SNR), etc.

Figure 3:
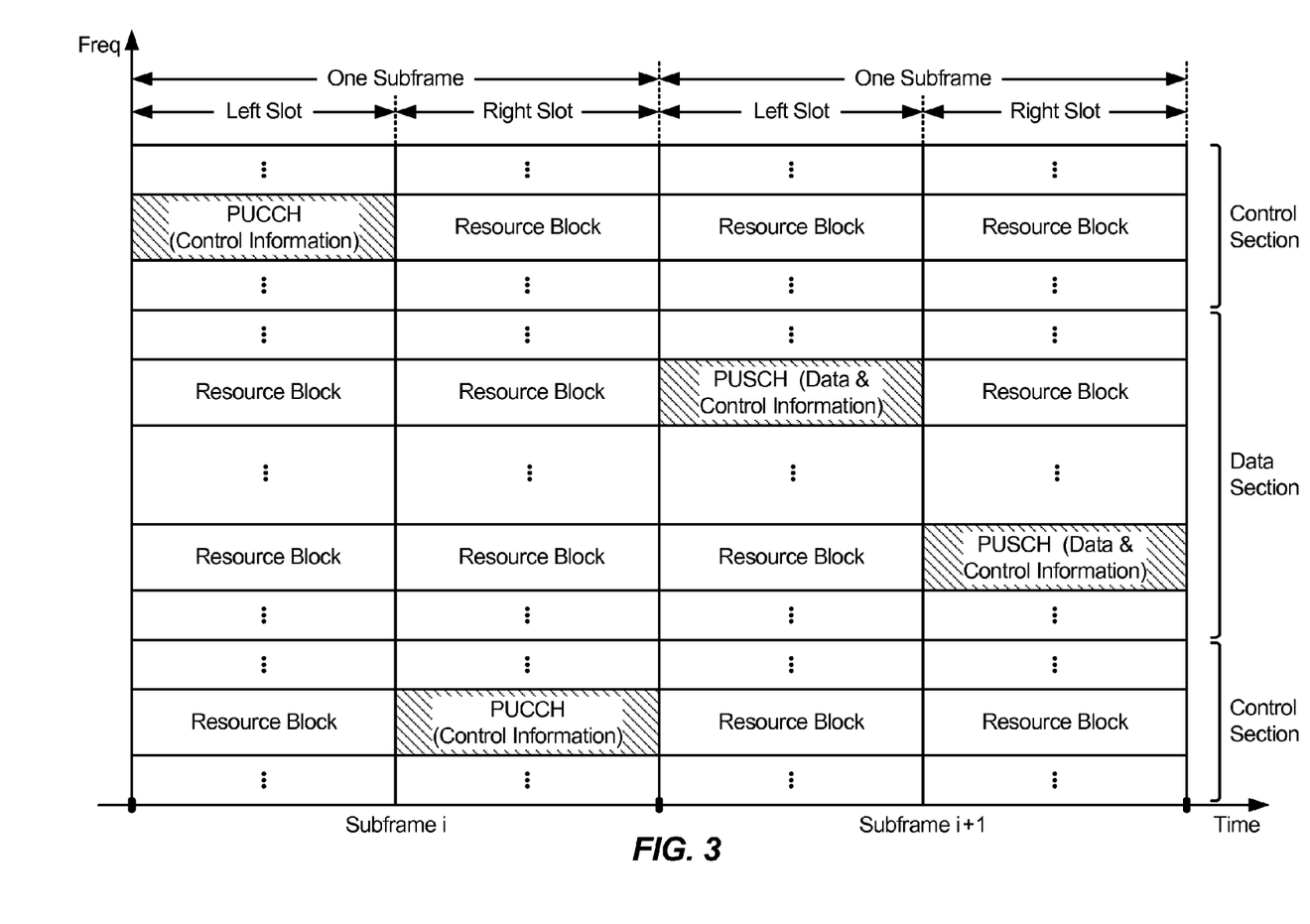
FIG. 3 is a block diagram conceptually illustrating an exemplary frame structure in uplink communications.

FIG. 3 is a block diagram conceptually illustrating an exemplary FDD and TDD (non-special subframe only) subframe structure in uplink long term evolution (LTE) communications. The available resource blocks (RBs) for the uplink may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The design in FIG. 3 results in the data section including contiguous subcarriers, which may allow a single UE to be assigned all of the contiguous subcarriers in the data section.

A UE may be assigned resource blocks in the control section to transmit control information to an eNodeB. The UE may also be assigned resource blocks in the data section to transmit data to the eNode B. The UE may transmit control information in a Physical Uplink Control Channel (PUCCH) on the assigned resource blocks in the control section. The UE may transmit only data or both data and control information in a Physical Uplink Shared Channel (PUSCH) on the assigned resource blocks in the data section. An uplink transmission may span both slots of a subframe and may hop across frequency as shown in FIG. 3. According to one aspect, in relaxed single carrier operation, parallel channels may be transmitted on the UL resources. For example, a control and a data channel, parallel control channels, and parallel data channels may be transmitted by a UE.

The PSC, SSC, CRS, PBCH, PUCCH, PUSCH, and other such signals and channels used in LTE/-A are described in 3GPP TS 36.211, entitled "Evolved Universal Terrestrial Radio Access (E-UTRA); Physical Channels and Modulation," which is publicly available.

Figure 4:
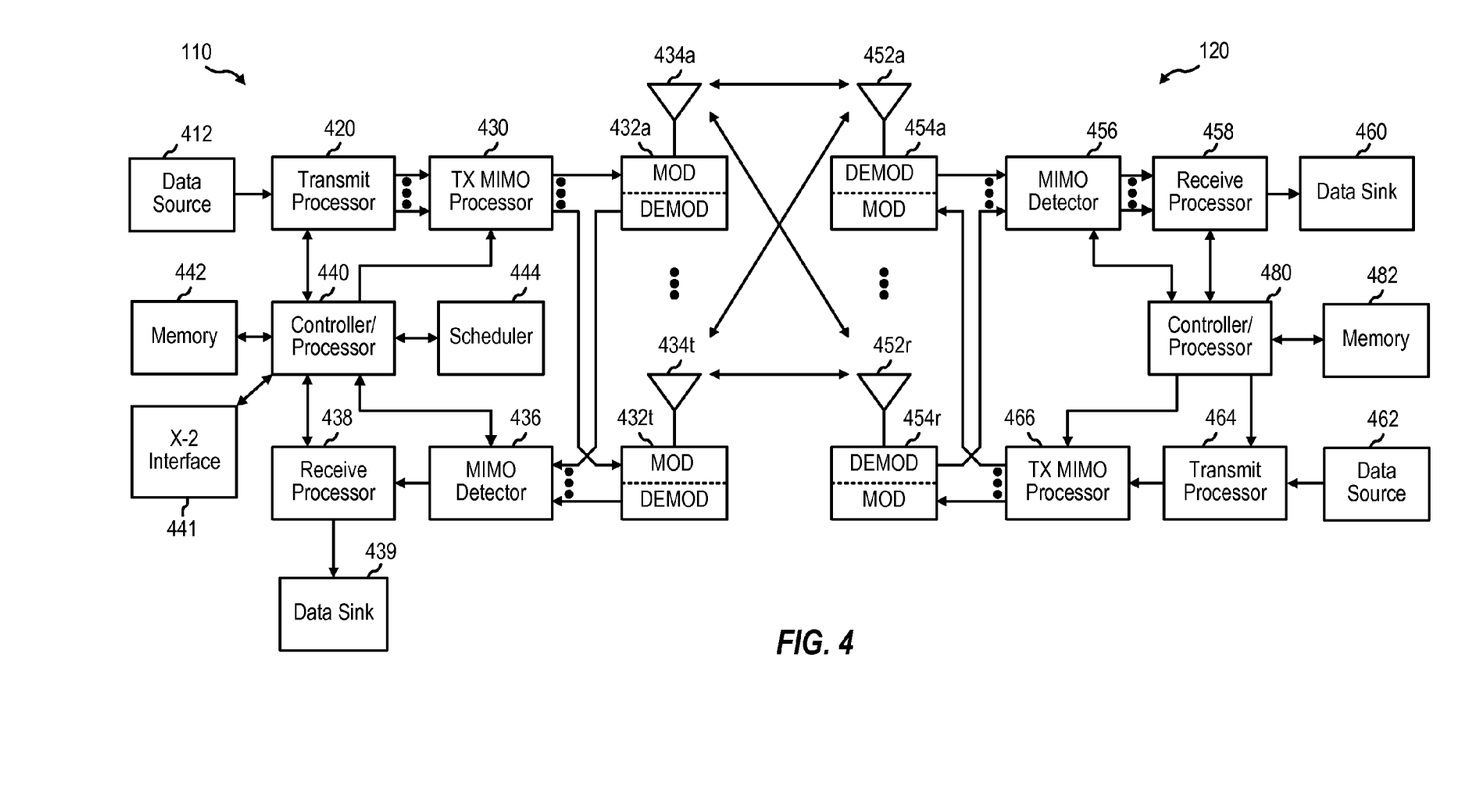
FIG. 4 is a block diagram conceptually illustrating a design of a base station/eNodeB and a UE configured according to one aspect of the present disclosure.

FIG. 4 shows a block diagram of a design of a base station/eNodeB 110 and a UE 120, which may be one of the base stations/eNodeBs and one of the UEs in FIG. 1. The base station 110 may be the macro eNodeB 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the PBCH, PCFICH, PHICH, PDCCH, etc. The data may be for the PDSCH, etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the PUSCH) from a data source 462 and control information (e.g., for the PUCCH) from the controller/processor 480. The processor 464 may also generate reference symbols for a reference signal. The symbols from the transmit processor 464 may be precoded by a TX MIMO processor 466 if applicable, further processed by the modulators 454a through 454r (e.g., for SC-FDM, etc.), and transmitted to the base station 110. At the base station 110, the uplink signals from the UE 120 may be received by the antennas 434, processed by the demodulators 432, detected by a MIMO detector 436 if applicable, and further processed by a receive processor 438 to obtain decoded data and control information sent by the UE 120. The processor 438 may provide the decoded data to a data sink 439 and the decoded control information to the controller/processor 440. The base station 110 can send messages to other base stations, for example, over an X2 interface 441.

The controllers/processors 440 and 480 may direct the operation at the base station 110 and the UE 120, respectively. The processor 440 and/or other processors and modules at the base station 110 may perform or direct the execution of various processes for the techniques described herein. The processor 480 and/or other processors and modules at the UE 120 may also perform or direct the execution of the functional blocks illustrated in use method flow chart FIG. 8, and/or other processes for the techniques described herein. The memories 442 and 482 may store data and program codes for the base station 110 and the UE 120, respectively. A scheduler 444 may schedule UEs for data transmission on the downlink and/or uplink.

Parallel Deinterleaving of LTE Interleaved Data

Figure 5:
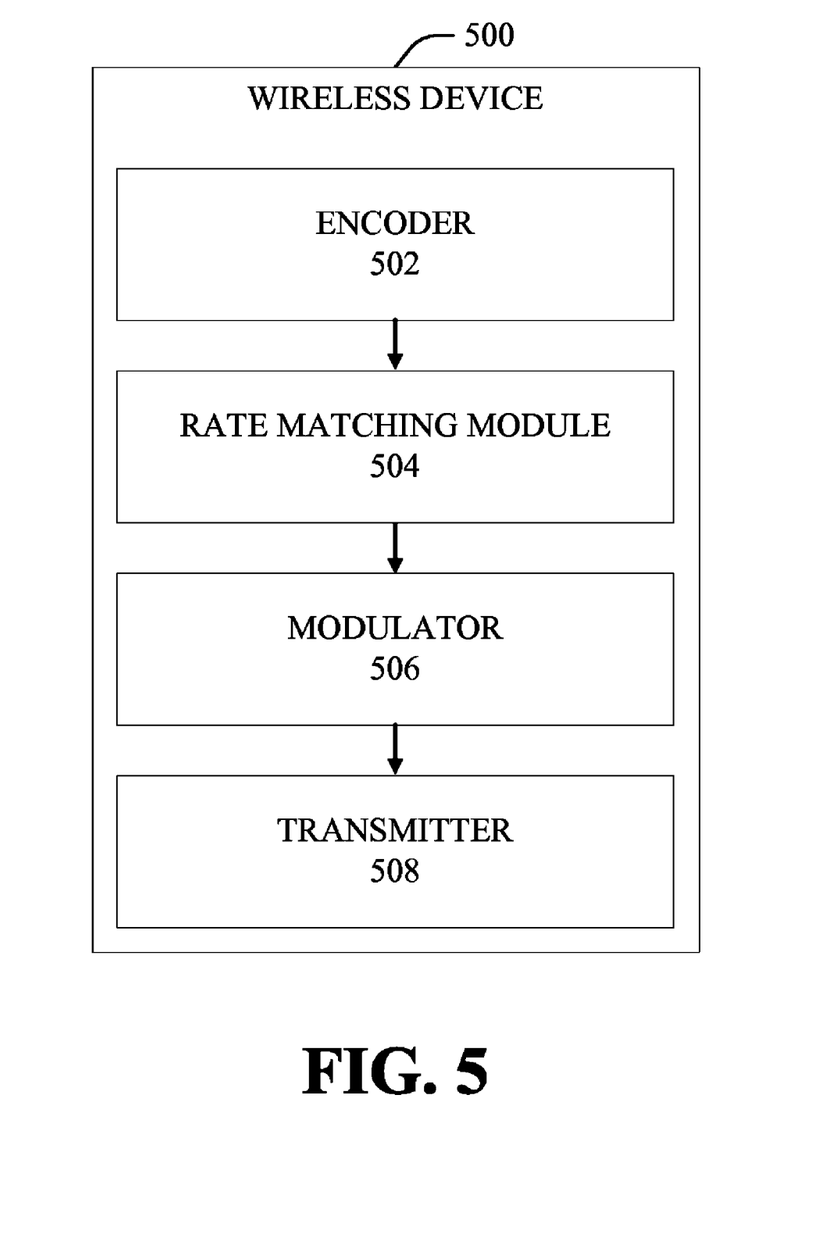
FIG. 5 depicts a block diagram of an example wireless device configured to implement channel processing according to one aspect of the present disclosure.

FIG. 5 illustrates an example wireless device 500 configured to implement channel processing in accordance with various aspects. The wireless device 500 may be a user equipment (UE), or a portion thereof, and/or a base station (e.g., an eNodeB, access point, etc.), or a portion thereof. The wireless device 500 may operate in a variety of wireless communication networks such as, but not limited to, a 3GPP Long Term Evolution (LTE) network, a 3GPP LTE-A network, a WCDMA network, a HSPA network, a CDMA network, a WiMAX network, etc.

Figure 6:
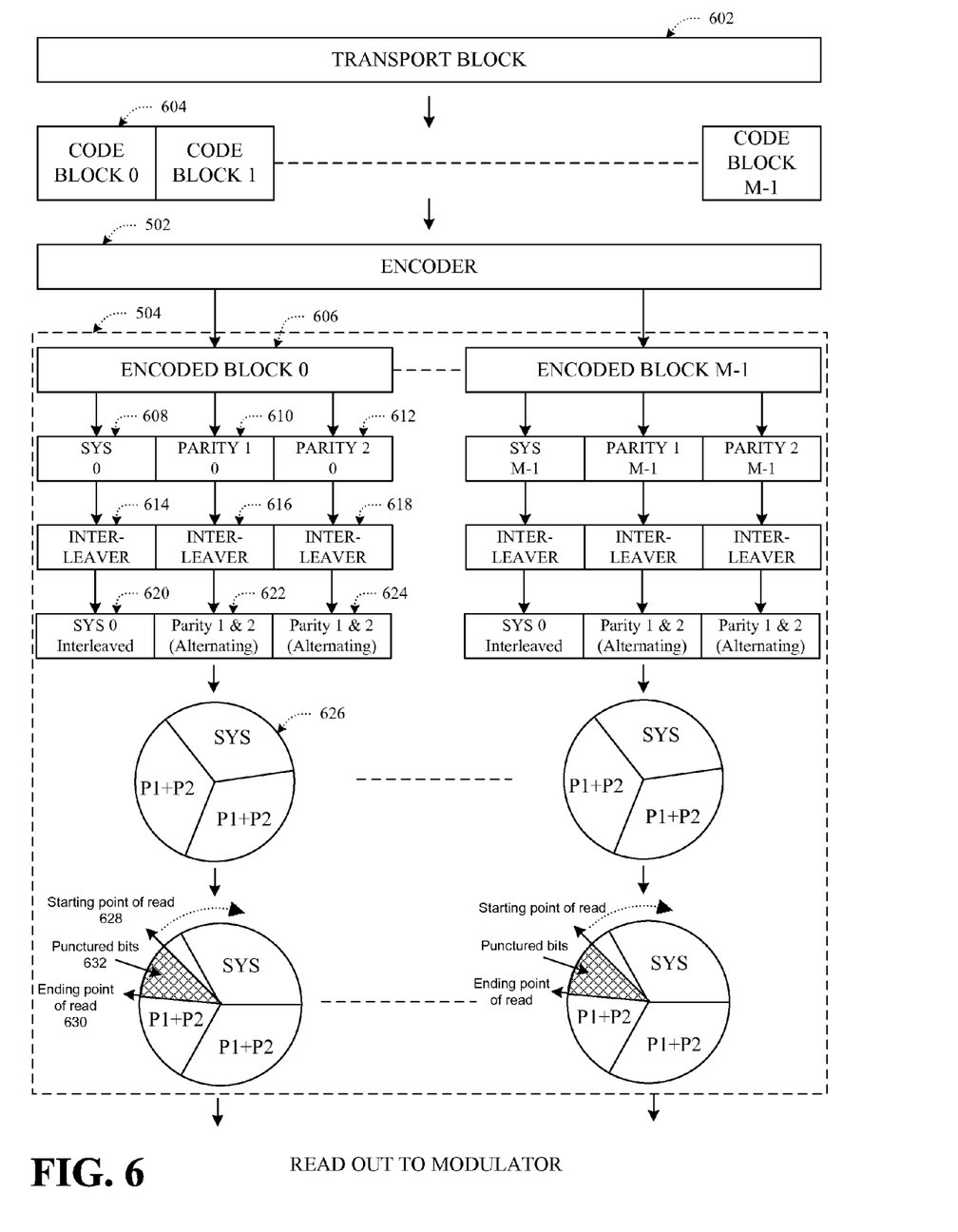
FIG. 6 illustrates a block diagram of example data flow of circular buffer rate matching according to one aspect of the present disclosure.

The wireless device 500 may include an encoder 502 which receives a transport block of data from higher layers, such as a medium access control layer. The transport block may be segmented into code blocks. The encoder 502 may encode the code blocks to generate a set of encoded blocks. In one example, the encoder 502 may implement Turbo coding; however, it is to be appreciated that other coding techniques may be employed. The set of encoded blocks may be provided to a rate matching module 504 that extracts, from the set of encoded blocks, a set of bits actually transmitted. The set of bits extracted by the rate matching module 504 are provided to a modulator 506 for modulation and, subsequent to modulation, to a transmitter 508 for transmission over a wireless link. FIG. 6 depicts an example data flow which illustrates the above described procedure.

As shown in FIG. 6, a transport block 602 may be segmented into code blocks 604. The code blocks are sent to the encoder 502 where they are encoded into encoded blocks 606. The encoded blocks (shown as encoded block 0 through encoded block M−1) are sent to the rate matching device 504. The rate matching device may perform rate matching as well as interleaving.

Interleaving is a process whereby bits are reorganized in a data block to reduce the effects of interference, as described below. In wireless communication systems, various techniques may be employed to increase the likelihood that wireless signals will be properly transmitted and received and that communications will not be interrupted. One such technique involves the reordering of data groups prior to transmission by a transmitting entity (such as a base station) and then eventually piecing back together the data groups by a receiving entity (such as a UE). The process of reordering the information prior to transmission is called interleaving. The process of putting the information back in order following reception is called de-interleaving. One benefit of interleaving is reducing the impact of potential interference to the transmitted signal. Without interleaving, if a portion of a data transmission encounters interference (or other transmission errors) and is not received by the receiving entity, all the data lost will be located in one portion of the data signal. When too much data is lost from the same portion of a data signal it may be difficult for a UE to correct for the lost data, which may result in interruption of wireless communications. If a portion of an interleaved signal is lost prior to reception all the data lost will not necessarily be from the same group of data. If portions of lost data are not contiguous it may be easier for the receiving entity (UE) to correct for the lost data and not interfere with wireless communications.

For example, if data bits 0-149 are transmitted in order and transmissions 30-34 are lost, the UE may have difficulty accounting for the five lost contiguous data bits (30, 31, 32, 33, and 34) and an interruption in communications may occur. However if the data bits 1-149 are interleaved prior to transmitting, they may be ordered such that sequential data bits are transmitted at different times from each other (for example transmissions 1-10 may be data bits 3, 22, 43, 59, 67, 75, 88, 99, 4, and 27). Thus, if transmissions 30-34 are lost, those transmission may correspond to non-sequential data bits (for example, 5, 20, 57, 81, 98). If the lost data bits are not sequential, the UE may be better able to correct for the lost data and avoid an interruption in communications.

For proper interleaving and de-interleaving the method for reordering data groups by the transmitter is known to the receiver so that at the receiving end the transmissions may be properly reordered for further data processing. Different wireless transmission networks may employ different schemes for interleaving. For purposes of illustration, interleaving as performed by Long Term Evolution (LTE) communications is described herein, but other interleaving schemes may be used.

As shown in FIG. 6, in LTE, the encoded bit sequence is split into three data streams, Systematic (S) 608, Parity 1 (P1) 610, and Parity 2 (P2) 612. Typically, the systematic bits are inserted first, followed by alternating insertion of first and second parity bits. These streams are interleaved, as shown in blocks 614, 616, and 618. In LTE, the Parity 1 and Parity 2 sequences are combined during interleaving. Thus, following interleaving there is one encoded interleaved block 620 for the Systematic bits and two combined encoded interleaved blocks 622 and 624 for the Parity 1 and Parity 2 bits. The blocks 608-624 are stored in memory locations in the rate matching module.

In LTE, the interleaved streams are then sent to a circular buffer 626 for storage and rate matching. Rate matching is a process whereby the number of bits to be transmitted is matched to the available bandwidth of the number of bits allowed to be transmitted. In certain instances the amount of data to be transmitted is less than the available bandwidth, in which case all the data to be transmitted (and one or more copies of the data) will be transmitted (a technique called repetition). In other instances the amount of data to be transmitted exceeds the available bandwidth, in which case a certain portion of the data to be transmitted will be omitted from the transmission (a technique called puncturing).

LTE rate matching is typically done using a circular buffer 626 shown in FIG. 6. The interleaved bits are stored in the circular buffer in the order of interleaved systematic followed by alternating interleaved P1 and interleaved P2. After the interleaved bits are stored in the circular buffer they are then read out to the modulator 506. The number of bits transmitted depends on the results of the rate matching. Upper layers may instruct lower layers as to which parts of data to be transmitted will be punctured and which parts will be transmitted. That instruction may include the starting bit location in a circular buffer and the number of bits to be transmitted.

For example, a starting point 628 in the circular buffer may be indicated along with an indication of a number of bits to be read out. That number may correspond with the available transmission bandwidth. Bits in the circular buffer 626 will then be read out, starting at the first bit location 628 and continuing around the circular buffer 626 (as illustrated the reading is conducted clockwise, but this direction is not required) until the ending bit location 630 is reached. Any bits in the circular buffer which are not to be transmitted are considered punctured bits 632 and are not read out from the rate matching module 504 to the modulator 506. If the available bandwidth exceeds the number of bits to be transmitted, bits may be read out again from the circular buffer to fill the allotted transmission bandwidth. During this repetition some bits of the circular buffer may be read out more than once. As shown in FIG. 6, in LTE the rate matching module may perform circular buffer based rate matching on a per code block basis. The location of the data in an LTE circular buffer may depend upon a row-column rectangular organization of the S, P1, and P2 bits.

The use of a circular buffer, while common in LTE, consumes additional resources (including additional memory). Offered is a method and implementation to avoid the use of a circular buffer in LTE communications and equipment. Rather than reading out to a modulator from a circular buffer, data may be read out directly from the output of the interleaving process (for example directly from blocks 614-618 or blocks 620-624 as shown in FIG. 6). In this manner an additional step and additional hardware may be removed from the process of interleaving and rate matching, thus improving system performance and decreasing the use of resources for these tasks.

To match the output format that would be expected from the use of a circular buffer, an improved rate matching module (or suitable component) may take rate matching instructions intended for a circular buffer (such as those from an upper layer) and convert those instructions to instructions which will read out data from the interleaved blocks in a manner that mirrors an output that would be expected from a circular buffer. For example, the improved rate matching module may indicate a starting bit in the interleaved blocks for reading out, as well as the location of subsequent bits to be read out. Data which may be contiguous in a circular buffer is not necessarily contiguous in the interleaved data blocks, thus resulting in data being read out in a different order from the interleaved data blocks. The translation of memory locations from what would be expected from a circular buffer to what is found following interleaving allows data to be transmitted directly to a modulator following interleaving without the use of a circular buffer.

Figure 7:
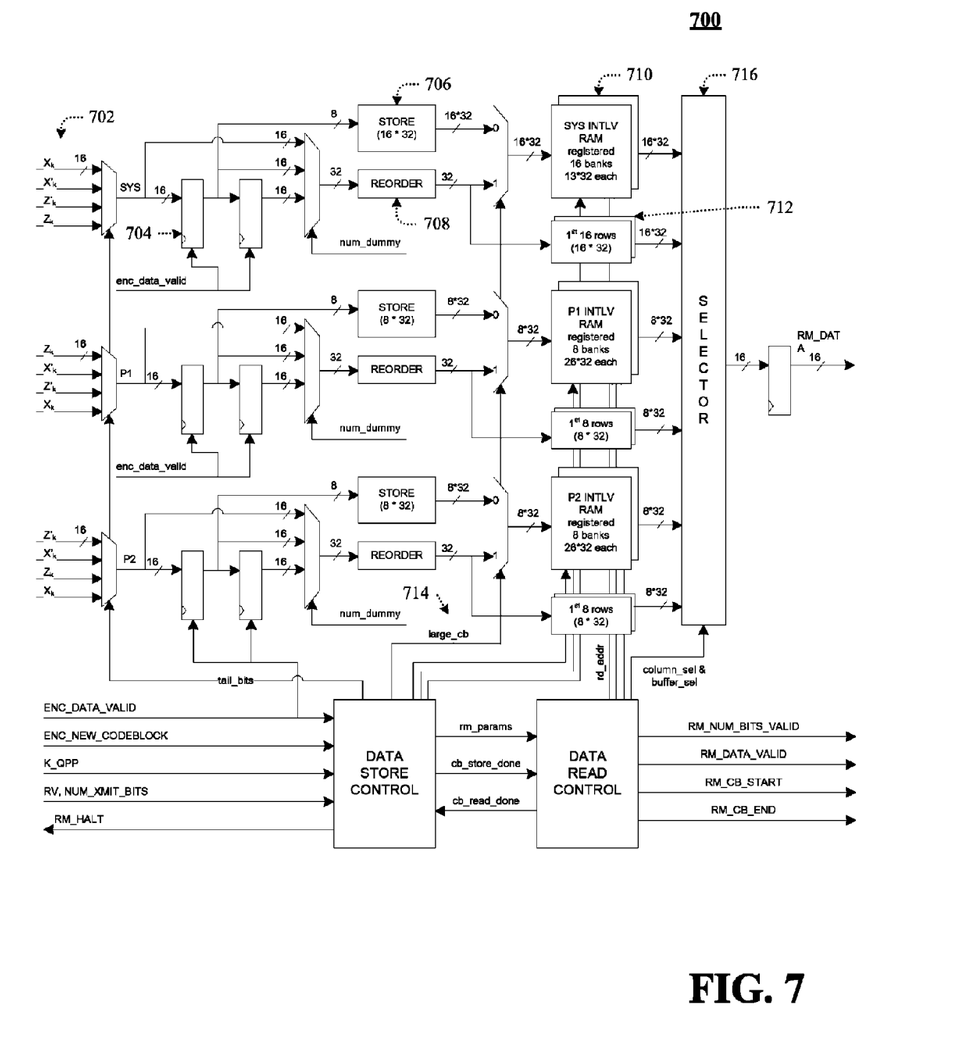
FIG. 7 depicts a block diagram of an example rate matching engine according to one aspect of the present disclosure.

In one aspect, the rate matching module 504 may include a rate matching engine 700 as shown in FIG. 7. The rate matching engine 700 may be used to implement the above method of performing interleaving and rate matching while circumventing a circular buffer yet maintaining throughput specifications associated with LTE. According to the illustrated example, the rate matching engine 700 includes inputs and outputs described below in Table 1.

TABLE 1

Inputs and Outputs of Rate-Matching Engine 700

| Name | Type | Description |
| --- | --- | --- |
| CLK | Input | Clock signal to drive synchronous logic. |
| RESET | Input | Synchronous reset to set flops to known state |
| ENC_NEW_CODEBLOCK | Input | Pulsed high for one clock on the first data transfer of a code block. |
| ENC_DATA_VALID | Input | Driven high to indicate that encoder data and control signals are valid on this clock. |
| $X_k$ | Input | One of the 4 data streams output by the encoder corresponds to systematic bits except during the tail bits. |
| $X_k'$ | Input | One of the 4 data streams output by the encoder Used only during the tail bits. |
| $Z_k$ | Input | One of the 4 data streams output by the encoder corresponds to parity 1 bits except during the tail bits. |
| $Z_k'$ | Input | One of the 4 data streams output by the encoder Corresponds to parity 2 bits except during the tail bits. |
| K_QPP | Input | Size of code block in bits. May vary from 40 to 6144. Valid when ENC_DATA_VALID is high. |
| RV | Input | Redundancy version for the code block. Varies from 0 to 3. Valid when ENC_DATA_VALID is high. |

TABLE 1-continued

Inputs and Outputs of Rate-Matching Engine 700

| Name | Type | Description |
| --- | --- | --- |
| NUM_XMIT_BITS | Input | Number of bits from the encoded data to forward to the modulator after rate matching. Valid when ENC_DATA_VALID is high. |
| NCB | Input | Circular buffer size in bits. |
| NUM_FILLER_BITS | Input | Number of filler bits at the start of each of the Xk and Zk data streams. Possible values are {0, 8, 16, 24, 32, 40, 48, 56}. Valid when ENC_DATA_VALID is high. |
| NUM_DUMMY | Input | The number of dummy bits added to the data stream when performing interleaving so that the total number of bits in the interleaver is a multiple of 32 |
| COL_SEL | Internal | Selects the column to be read out at a particular point in time |
| BUF_SEL | Internal | Selects between Systematic, Parity 1 and Parity 2 bits to be read out at a particular point in time |
| RD_ADDR | Internal | The read address based on the row number being read out at a particular point in time |
| RM_HALT | Output | Asserted high by the rate matching engine on the last clock edge of a code block if it cannot accept a new code block. The encode engine waits for this signal to be low before it can start sending a code block. Once the encode engine starts sending a code block it ignores this signal until the next code block. |
| RM_DATA_VALID | Output | Asserted high to indicate that valid data exists on the RM_DATA bus. |
| RM_CB_START | Output | Asserted high for one clock on the first valid data transfer of the code block. |
| RM_CB_END | Output | Asserted high for one clock on the last valid data transfer of the code block. |
| RM_NUM_BITS_VALID | Output | Valid when rm_cb_end and rm_data_valid are asserted and indicates the number of valid bits on the last data transfer of the code block. It is equal to (NUM_XMIT_BITS MOD 16). |
| RM_DATA | Output | Rate matched output data sent to the modulator. |

The rate matching engine inputs are data bit streams 702 from the encoder, shown on the left hand side of the FIG. 7. Each stream may include 16 bits, wherein data is received on all 16 bits for large code blocks (e.g., greater than 248 bits) and on the lower 8 bits for small code blocks. The hardware 700 receives one code block of data at a time from the encoder 504, received as illustrated at 16 bits per clock cycle. 16 bits per clock cycle are input so that the eventual output of the hardware 700 meets the throughput demands of LTE. This results in the banking structure 710 shown in FIG. 7. Alternatively, a single pipeline structure or alternating number of bits for each clock cycle may be employed. The rate matching engine 700 also obtains control information associated with the code blocks, such as a code block length, a redundancy version, and a number of bits to forward to the modulator 506 after rate matching.

The data streams are separated into Systematic, Parity 1, and Parity 2, with the Systematic bits (SYS) shown input at the top of FIG. 7, the Parity 1 bits (P1) shown input in the middle of the figure, and the Parity 2 bits (P2) shown input at the bottom of the figure. As an example, the Systematic stream is discussed in detail, but the Parity 1 and Parity 2 hardware functions in a similar manner. Encoded input bits are sent to delay storage elements 704 to ensure possession of a sufficient portion of the data stream prior to interleaving. Interleaving in LTE depends on a row-column format. Thus, a sufficient number of bits must be saved to ensure proper interleaving. Once a sufficient quantity of data has been received, the data is stored and reordered as shown in hardware blocks 706 and 708 to put the data into interleaved format. The interleaved data is then passed to memory buffer banks 710 for storage. From the INTLV RAM memory blocks, the interleaved data is chosen by the selector 716, which locates and reads out data in a manner that is translated to match how the data would have been read out from a circular buffer as described above.

The interleaver memory for each stream includes two buffers to support simultaneously reading and writing to the interleaver memory without collision. As shown, a flag (large_cb) 714 indicates if the code block is large (for example, above 248 bits) or small. If the code block is small for the Systematic stream, the first 16 rows of data are also populated into special memory block 712 after reordering (8 rows for the Parity 1 or Parity 2 stream). The special memory blocks duplicate the first few rows of interleaved data preventing the same memory blocks from being accessed twice during the same clock cycle. If the code block size is large the upper data stream may also be used. For smaller code blocks, interim storage blocks 704 may not be used. In one example, a systematic interleaver memory, corresponding to the systematic data stream, may include 16 banks with 13 locations each. A location can be 32 bits wide. Parity interleaver memories, corresponding to first and second parity streams, may include 8 banks with 26 locations each.

In one aspect, for large code blocks, data is written into the interleaver memory in the order in which it is received. For example, a write pointer, at the start of a code block, points to location 0 of bank 0 in the interleaver memory. After every write (e.g., after 32 bits are written to a location pointed to by the write pointer), the write pointer moves ahead. The write pointer cycles through location 0 for all banks before moving to location 1 of bank 0. The write pointer continues this cycle until all bits of a code block are received from encoder 502. Each bit position in a location of the interleaver memory corresponds to a column. For example, bit position 0 corresponds to column 0

For small code blocks, data may be rearranged according to a specified row column permutation and stored in external registers. Contents of the external registers are transferred to the interleaver memory after an entire code block is received. After a complete code block is stored in the interleaver memories, the rate matching engine 700 may read out the data in an interleaved order to the modulator 506. In an example, data can be read out in a bit-reversed column order.

In one aspect, the rate matching engine 700 may include architecture to enable data to be read out to the modulator 306 in a bit-reversed column order. The bit-reversed column order refers to a bit reversal of a column number. For example, column 1 can be represented as a 5-bit binary number, 00001. Reversing the bit orders results in 10000, which represents 16 in binary. Accordingly, columns of the interleaver memories may be read out in the following order: {0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31}. A starting point of a read can be determined based upon a redundancy version (RV) value, a buffer size ($K_w$), and a circular buffer size ($N_{cb}$). Table 2 provides possible starting point values for various values of the parameters.

TABLE 2

Starting point of read

| ceil ($12N_{cb}/K_w$) | RV | # of columns to skip = 2 * ceil ($12N_{cb}/K_w$) * RV + 2 | Starting column # | Starting column position from start of buffer | Starting buffer |
| --- | --- | --- | --- | --- | --- |
| don't care | 0 | 2 | 8 | 2 | Systematic |
| 5 | 1 | 12 | 6 | 12 | Systematic |
| 5 | 2 | 22 | 13 | 22 | Systematic |
| 5 | 3 | 32 | 0 | 0 | Parity |
| 6 | 1 | 14 | 14 | 14 | Systematic |
| 6 | 2 | 26 | 11 | 26 | Systematic |
| 6 | 3 | 38 | 24 | 3 | Parity |
| 7 | 1 | 16 | 1 | 16 | Systematic |
| 7 | 2 | 30 | 15 | 30 | Systematic |
| 7 | 3 | 44 | 12 | 6 | Parity |
| 8 | 1 | 18 | 9 | 18 | Systematic |
| 8 | 2 | 34 | 16 | 1 | Parity |
| 8 | 3 | 50 | 18 | 9 | Parity |
| 9 | 1 | 20 | 5 | 20 | Systematic |
| 9 | 2 | 38 | 24 | 3 | Parity |
| 9 | 3 | 56 | 6 | 12 | Parity |
| 10 | 1 | 22 | 13 | 22 | Systematic |
| 10 | 2 | 42 | 20 | 5 | Parity |
| 10 | 3 | 62 | 30 | 15 | Parity |
| 11 | 1 | 24 | 3 | 24 | Systematic |
| 11 | 2 | 46 | 28 | 7 | Parity |
| 11 | 3 | 68 | 9 | 18 | Parity |
| 12 | 1 | 26 | 11 | 26 | Systematic |
| 12 | 2 | 50 | 18 | 9 | Parity |
| 12 | 3 | 74 | 21 | 21 | Parity |

A column pointer may be initialized to the starting column of the starting buffer. A read location (e.g., row number) may be initialized to 0 to point to a first entry of the starting column. In an example, the rate matching engine 700 may read 16 bits out for each clock cycle starting at this point. The 16 bits include one bit from each bank of the interleaver memory. When a number of bits available in a column is less than 16, remaining bits are read from a next bit reversed column number in bit-reversed order.

Figure 8:
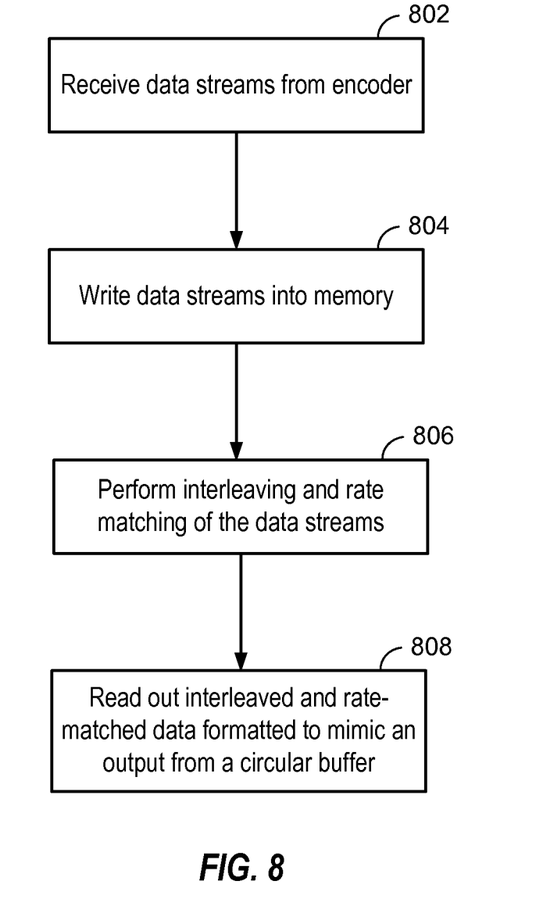
FIG. 8 depicts a flowchart for performing rate matching according to one aspect of the present disclosure.

FIG. 8 is a diagram illustrating rate matching according to one aspect of the present disclosure. As shown in block 802, data streams are received from an encoder. As shown in block 804, the data streams are written into memory. As shown in block 806, interleaving and rate matching are performed on the data streams. As shown in block 808, the interleaved and rate matched data are read out in an order formatted to mimic an output from a circular buffer.

In one configuration, an apparatus is configured for wireless communication including means for means for receiving data streams from an encoder, means for writing the data streams into memory, means for performing interleaving and rate matching of the data streams, and means for reading out the interleaved and rate matched data in an order formatted to mimic an output from a circular buffer. In one aspect, the aforementioned means may be transmit processor 420, transmit processor 464, controller/processor 440, controller/processor 480, rate matching module 504, and rate matching engine 700. In another aspect, the aforementioned means may be a module or any apparatus configured to perform the functions recited by the aforementioned means.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of rate-matching in a wireless communication system, the method comprising:
receiving a plurality of data streams from an encoder;
writing the plurality of data streams into memory;
performing interleaving of the plurality of data streams;
combining data from at least two of the plurality of interleaved data streams into a single intermixed data section;
performing rate matching of the interleaved data streams, including the intermixed data section; and
reading out the interleaved and rate matched data directly from an interleaver to a modulator, including the intermixed data section, in an order formatted to mimic an output from a circular buffer.

2. The method of claim 1 further comprising determining a starting bit of the reading out by translating a starting bit of a circular buffer to a starting bit of the interleaved and rate matched data.

3. The method of claim 1 in which an order of the reading out corresponds to a bit-reversed column order.

4. The method of claim 1 in which the interleaved and rate matched data are read out for transmission.

5. An apparatus for rate-matching in a wireless communication system, the apparatus comprising:
means for receiving a plurality of data streams from an encoder;
means for writing the plurality of data streams into memory;
means for performing interleaving of the plurality of data streams;
means for combining data from at least two of the plurality of interleaved data streams into a single intermixed data section;
means for performing rate matching of the interleaved data streams, including the intermixed data section; and
means for reading out the interleaved and rate matched data directly from an interleaver to a modulator, including the intermixed data section, in an order formatted to mimic an output from a circular buffer.

6. The apparatus of claim 5 further comprising means for determining a starting bit of the reading out by translating a starting bit of a circular buffer to a starting bit of the interleaved and rate matched data.

7. The apparatus of claim 5 in which an order of the reading out corresponds to a bit-reversed column order.

8. The apparatus of claim 5 in which the interleaved and rate matched data are read out for transmission.

9. A computer program product for rate-matching in a wireless communication system, the computer program product comprising:
   a non-transitory computer-readable medium having non-transitory program code recorded thereon, the program code comprising:
      program code to receive a plurality of data streams from an encoder;
      program code to write the plurality of data streams into memory;
      program code to perform interleaving of the plurality of data streams;
      program code to combine data from at least two of the plurality of interleaved data streams into a single intermixed data section;
      program code to perform rate matching of the interleaved data streams, including the intermixed data section; and
      program code to read out the interleaved and rate matched data directly from an interleaver to a modulator, including the intermixed data section, in an order formatted to mimic an output from a circular buffer.

10. The computer program product of claim 9 in which the program code further comprises program code to determine a starting bit of the reading out by translating a starting bit of a circular buffer to a starting bit of the interleaved and rate matched data.

11. The computer program product of claim 9 in which an order of the reading out corresponds to a bit-reversed column order.

12. The computer program product of claim 9 in which the interleaved and rate matched data are read out for transmission.

13. An apparatus for rate-matching in a wireless communication system, the apparatus comprising:
   a memory; and
   at least one processor coupled to the memory, the at least one processor being configured:
      to receive a plurality of data streams from an encoder;
      to write the plurality of data streams into memory;
      to perform interleaving of the plurality of data streams;
      to combine data from at least two of the plurality of interleaved data streams into a single intermixed data section;
      to perform rate matching of the interleaved data streams, including the intermixed data section; and
      to read out the interleaved and rate matched data directly from an interleaver to a modulator, including the intermixed data section, in an order formatted to mimic an output from a circular buffer.

14. The apparatus of claim 13 in which the at least one processor is further configured to determine a starting bit of the reading out by translating a starting bit of a circular buffer to a starting bit of the interleaved and rate matched data.

15. The apparatus of claim 13 in which an order of the reading out corresponds to a bit-reversed column order.

16. The apparatus of claim 13 in which the interleaved and rate matched data are read out for transmission.

* * * * *